United States Patent [19]

Gill et al.

[11] Patent Number: 5,173,436
[45] Date of Patent: Dec. 22, 1992

[54] METHOD OF MANUFACTURING AN EEPROM WITH TRENCH-ISOLATED BITLINES

[75] Inventors: Manzur Gill, Rosharon, Tex.; Sebastiano D'Arrigo, Cannes, France; David J. McElroy, Allen, Tex.

[73] Assignee: Texas Instruments Incorporated, Dallas, Tex.

[21] Appl. No.: 722,732

[22] Filed: Jun. 27, 1991

Related U.S. Application Data

[62] Division of Ser. No. 439,766, Nov. 21, 1989, Pat. No. 5,051,795.

[51] Int. Cl.[5] .................... H01L 21/76; H01L 21/302
[52] U.S. Cl. .......................................... 437/43; 437/67; 437/979
[58] Field of Search ................ 437/43, 49, 63, 64, 437/67, 69, 70, 979, 985; 148/DIG. 50; 357/23.5

[56] References Cited

U.S. PATENT DOCUMENTS

| | | | |
|---|---|---|---|
| 4,455,740 | 6/1984 | Iwai | 148/DIG. 50 |
| 4,590,504 | 5/1986 | Guterman | 357/23.5 |
| 4,597,060 | 6/1986 | Mitchell et al. | 357/23.5 |
| 4,698,900 | 10/1987 | Esquivel | 148/DIG. 50 |
| 4,750,024 | 6/1988 | Schreck | 357/23.5 |
| 4,780,424 | 10/1988 | Holler et al. | 437/43 |
| 4,835,115 | 5/1989 | Eklund | 437/67 |
| 4,853,895 | 8/1989 | Mitchell et al. | 437/43 |
| 4,892,840 | 1/1990 | Esquivel et al. | 437/67 |
| 4,905,062 | 2/1990 | Esquivel et al. | 357/23.5 |
| 4,912,676 | 3/1990 | Paterson et al. | 357/23.5 |
| 4,924,437 | 5/1990 | Paterson et al. | 437/43 |
| 4,942,448 | 7/1990 | Tsukamoto et al. | 357/49 |
| 4,947,222 | 8/1990 | Gill et al. | 357/23.5 |
| 4,951,103 | 8/1990 | Esquivel et al. | 357/23.5 |
| 4,990,979 | 2/1991 | Otto | 357/23.5 |
| 5,045,489 | 9/1991 | Gill et al. | 437/43 |
| 5,051,796 | 9/1991 | Gill | 357/23.5 |

FOREIGN PATENT DOCUMENTS 58-130571 8/1983 Japan.
62-123764 6/1987 Japan.

Primary Examiner—Olik Chaudhuri
Assistant Examiner—C. Chaudhari
Attorney, Agent, or Firm—W. James Brady, III; Theodore D. Lindgren; Richard L. Donaldson

[57] ABSTRACT

An electrically-erasable, electrically-programmable ROM or an EEPROM is constructed using a floating-gate transistor with or without a split gate. The floating-gate transistor may have a self-aligned tunnel window of sublithographic dimension positioned on the opposite side of the source from the channel and drain, in a contact-free cell layout, enhancing the ease of manufacture and reducing cell size. In this cell, the bitlines and source/drain regions are buried beneath relatively thick silicon oxide and the floating gate extends over the thick silicon oxide. Programming and erasing are accomplished by causing electrons to tunnel through the oxide in the tunnel window. The tunnel window has a thinner dielectric than the remainder of the oxides under the floating gate to allow Fowler-Nordheim tunneling. Trenches and ditches are used for electrical isolation between individual memory cells, allowing an increase in cell density.

20 Claims, 9 Drawing Sheets

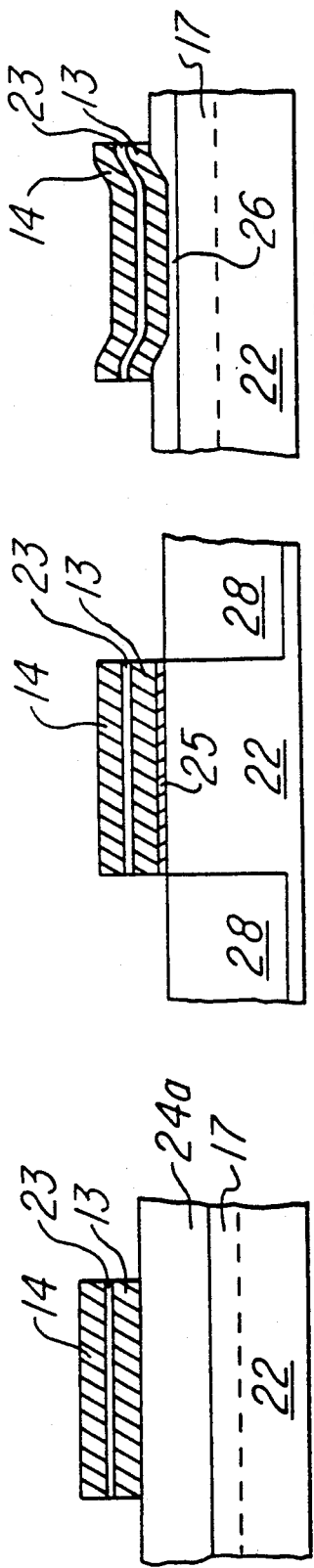
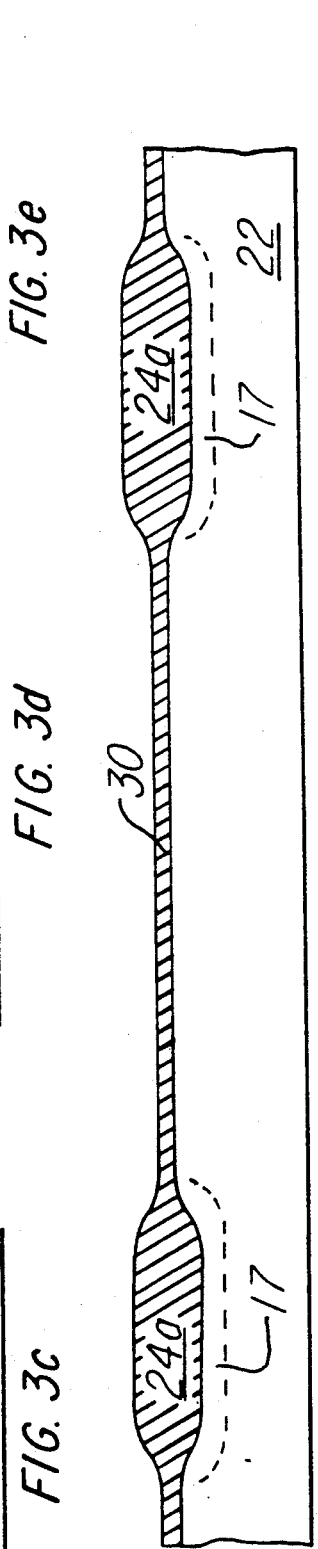
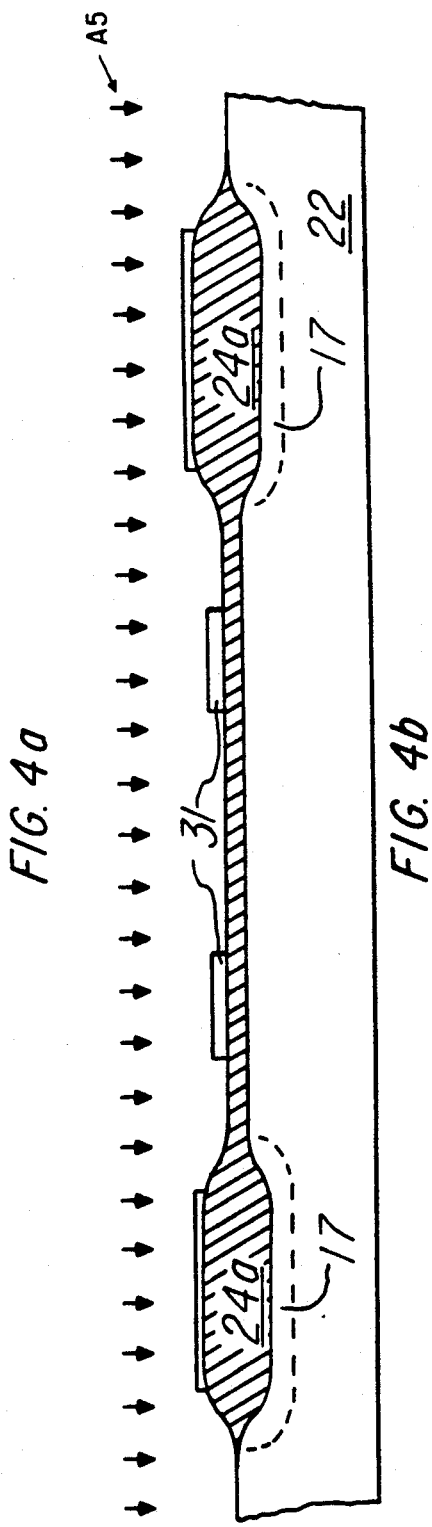

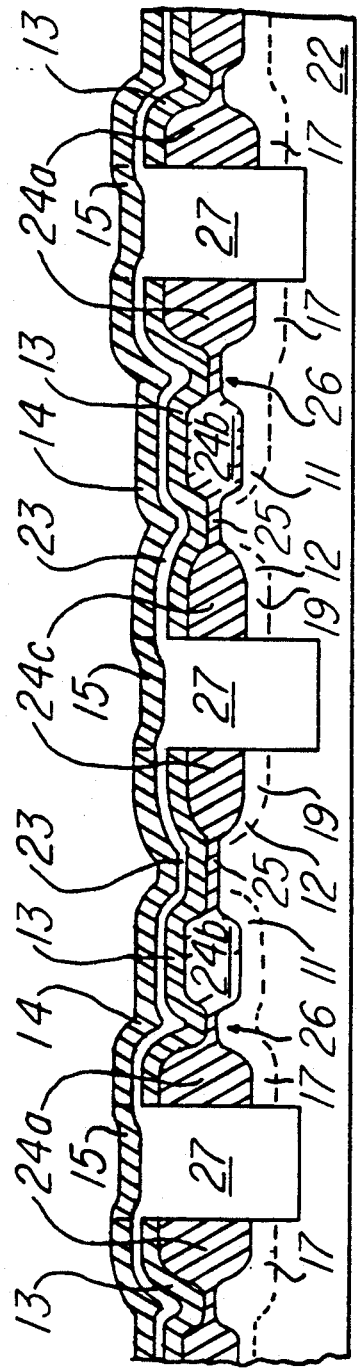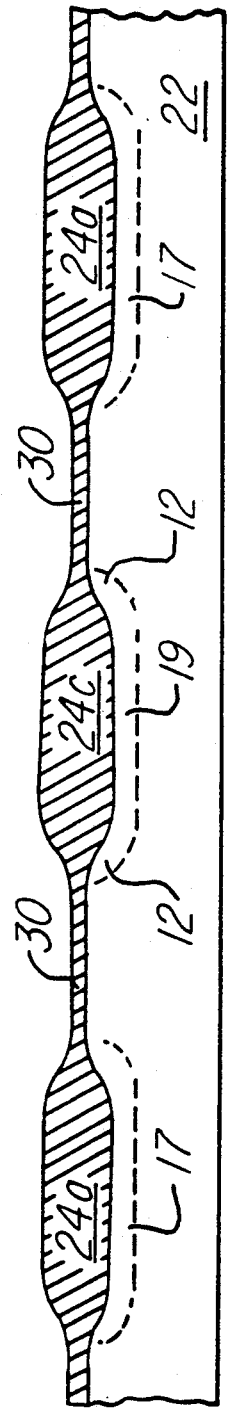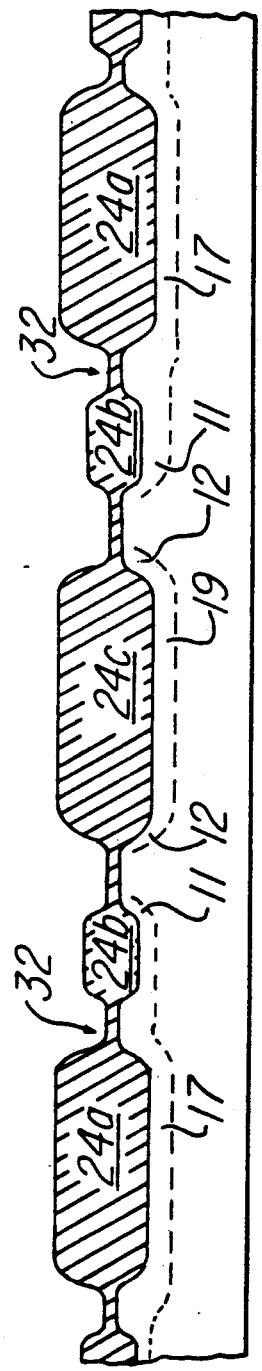

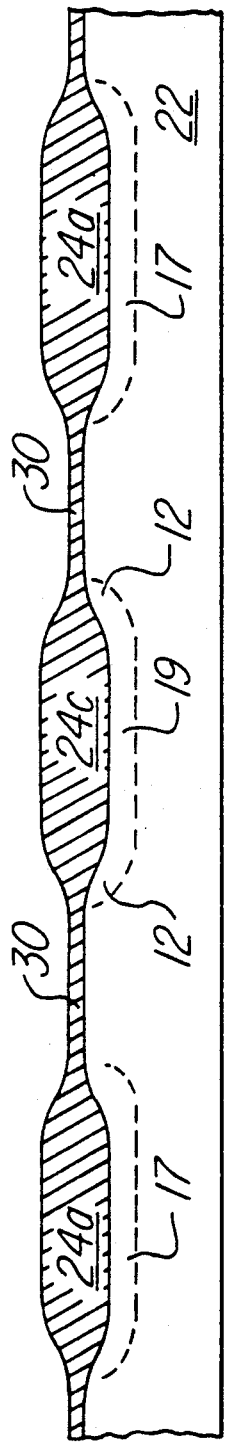
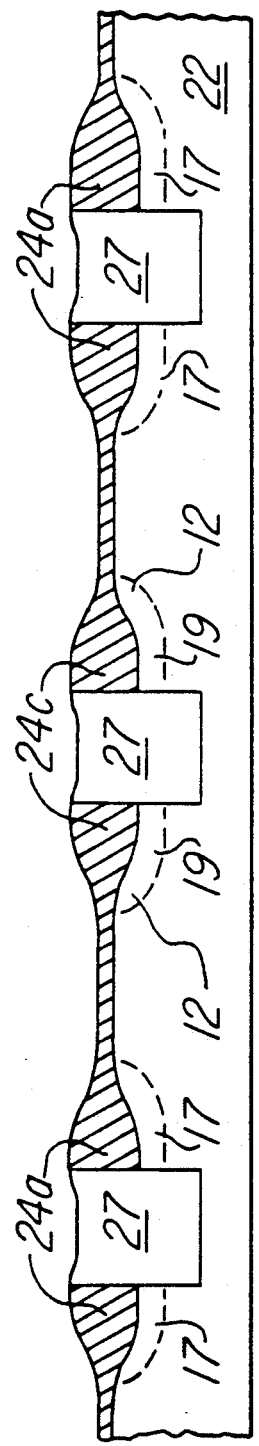
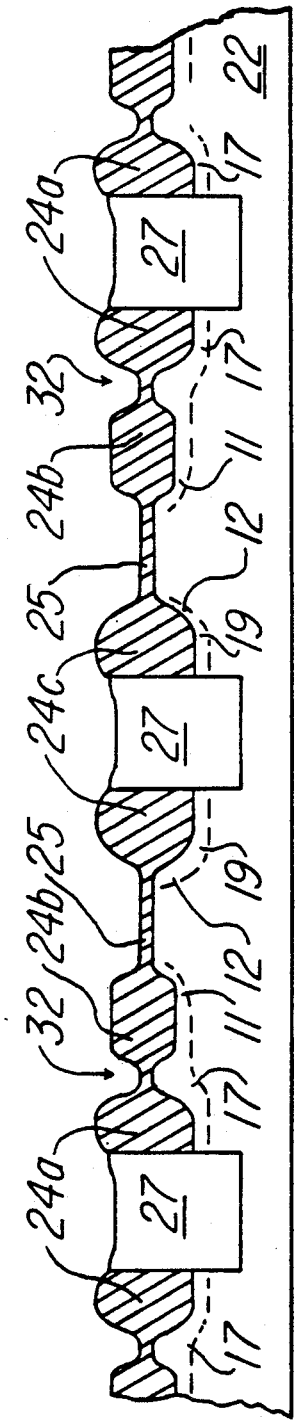

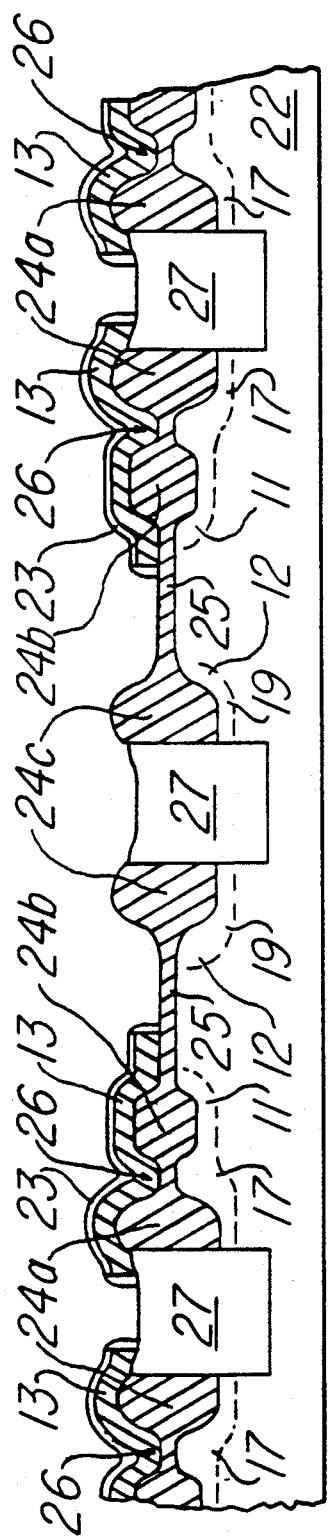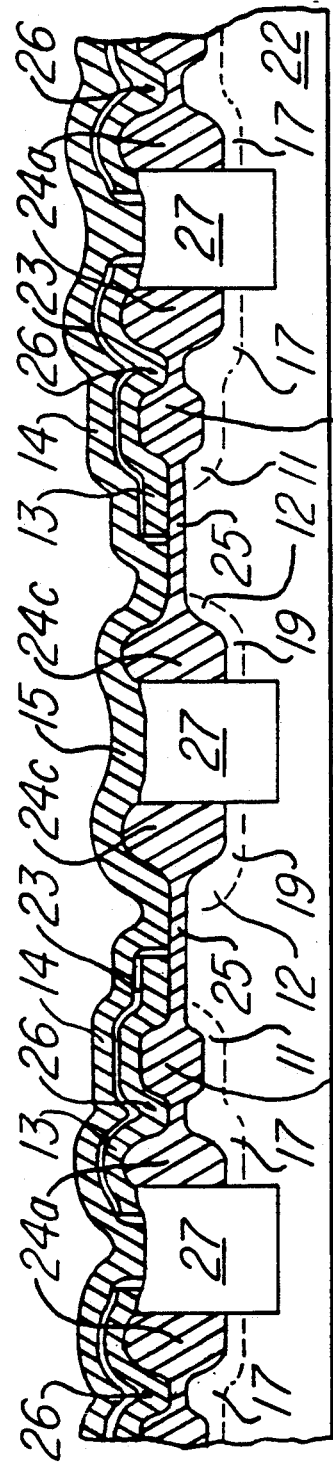

METHOD OF MANUFACTURING AN EEPROM WITH TRENCH-ISOLATED BITLINES

This is a division, of application Ser. No. 07/439,766, now U.S. Pat. No. 5,051,795, filed Nov. 21, 1989.

RELATED PATENT APPLICATION

This application discloses subject matter also disclosed in co-pending U.S. patent applications Ser. No. 07/219,529, now abandoned, filed Jul. 15, 1988, and Ser. No. 07/360,558, now abandoned filed Jun. 2, 1989, both of which are also assigned to Texas Instruments Incorporated.

BACKGROUND OF THE INVENTION

This invention relates to nonvolatile semiconductor memory devices, more particularly, to an electrically-erasable, electrically-programmable ROM (read-only-memory) of the floating-gate type and to a method for making such a device.

EPROMs, or electrically-programmable ROMs, are nonvolatile field-effect devices with a floating-gate structure. In general, an EPROM floating gate is programmed by applying proper voltages to the source, drain and control gate of each cell, causing high current through the source-drain path and charging of the floating gate by hot electrons. The EPROM type of device is usually erased by ultraviolet light, which requires a device package having a quartz window above the semiconductor chip. Packages of this type are expensive in comparison with the plastic packages ordinarily used for other memory devices such as DRAMs (dynamic-random-access-memories). For this reason, EPROMs are generally more expensive than plastic-packaged devices. EPROM devices of this type, and methods of manufacture, are disclosed in U.S. Pat. Nos. 3,984,822; 4,142,926; 4,258,466; 4,376,947; 4,326,331; 4,313,362; 4,373,248; or 4,750,24; for example.

EEPROMs, or electrically-erasable, electrically-programmable ROMs, have been manufactured by various processes, and usually require much larger cell sizes than standard EPROMs. The structures and the manufacturing processes are usually more complex. EEPROM arrays can be mounted in opaque plastic packages that reduce the packaging cost. Nevertheless, EEPROM arrays have been more expensive on a per-bit basis, in comparison with EPROM arrays, due to larger cell size and to more complex manufacturing processes.

As compared to EPROM arrays, EEPROM arrays require a wider range of voltages applied to bitlines for the purposes of programming, reading and erasing. Because the bitlines are connected to many cells in the array other than the cell being programmed, read, or erased, the wider range of voltages increases the possibility that one or more of the other cells will be inadvertently programmed or erased. The problem is particularly present in so-called "virtual-ground" arrays such as that disclosed in U.S. Pat. No. 4,281,397.

Flash EEPROMs have the advantage of smaller cell size in comparison with standard EEPROMs because the cells are not erased individually. Instead, the array of cells is erased in bulk.

Currently available flash EEPROMs require at least two external power supplies, one for programming and erasing and another for reading. Typically, a 12-volt power supply is used for programming and erasing and a 5-volt power supply is used during read operations. It is desirable, however, to employ a single relatively low-voltage supply for all of the programming, erasing and reading operations. For example, on-chip charge-pump techniques may be used to generate higher voltages from the 5-volt supply if the memory cells of the array are designed to be programmed and erased while drawing a relatively small current. In general, cells designed to use Fowler-Nordheim tunneling for programming and erasing require relatively small current in comparison to the current required when using hot-electron programming.

The EEPROMs disclosed in co-pending U.S. patent applications Ser. Nos. 07/219,528; 07/219,529, 07/219,530 and 07/360,558, now, all abandoned, provide greatly improved structures and methods for making cells having reduced size and ease of manufacture, resulting in a device requiring one relatively low-voltage (perhaps +5v) external power supply for the chip. The devices of those inventions use Fowler-Nordheim tunneling for erasure and for programming. However, the devices of those inventions require LOCOS isolation between bitlines. The LOCOS isolation in turn requires scarce additional space on an integrated circuit substrate.

There is need for a memory cell structure that can be downscaled in size and can be packaged in a less expensive opaque plastic package without requirement for space-consuming LOCOS isolation between bitlines of a memory array.

SUMMARY OF THE INVENTION

In accordance with one embodiment of the invention, a nonvolatile memory array, or an EEPROM array, is constructed using either a one-transistor structure or a one and one-half transistor (split-gate) structure. The split-gate structure requires a part of the control gate and part of the floating gate to be located over the channel region. The floating-gate of each memory cell may have a small self-aligned tunnel window positioned above the source away from the channel region, or the tunnel may be positioned above the source near the channel region. The EEPROM device has a contact-free cell layout, enhancing the ease of manufacture and reducing cell size. The device has bitlines (source/drain regions) that are buried beneath relatively thick silicon oxide, allowing a favorable coupling of control gate voltage to the floating gate. Programming and erasing are accomplished using the tunnel window area, which permits use of a relatively small current drawn from a charge-pump voltage supply for programming and erasing. The tunnel window has a dielectric that is thinner than either the source/drain oxide or the gate insulator, allowing Fowler-Nordheim tunneling. The floating gate extends over the relatively thick silicon oxide regions that bury the bitlines, resulting in a favorable capacitive ratio for coupling control-gate voltages to floating gates during writing and erasing operations. The structure uses dedicated drain and ground lines, rather than a virtual-ground circuit layout, and uses trench isolation between the bitlines of adjacent cells.

In one type of embodiment, the structure of the invention may also be programmed by hot electron injection, a method typically used to program electrically-programmable, read-only memories (EPROMs).

BRIEF DESCRIPTION OF THE DRAWINGS

The novel features believed characteristic of the invention are set forth in the appended claims. The invention itself, however, as well as other objects and advantages thereof, will be best understood by reference to the following description of particular embodiments thereof, when read in conjunction with the accompanying drawings, in which:

FIGS. 3a-3e are elevation views in section of the semiconductor device of FIG. 1, respectively taken along the lines a—a, b—b, c—c, d—d, and e—e of FIG. 2;

FIGS. 4a-4f are elevation views in section of the semiconductor device of FIG. 1, taken along the lines a—a of FIG. 2 at successive stages in the manufacture thereof;

FIGS. 5a-5e are elevation views in section of an alternative embodiment of the semiconductor device of FIG. 1, taken along the lines a—a of FIG. 2 at successive stages in the manufacture thereof; and FIG. 6a-6e are elevation views in section of a split-gate embodiment of the semiconductor device of this invention at successive stages in the manufacture thereof.

DETAILED DESCRIPTION OF SPECIFIC EMBODIMENTS

Figure 1:
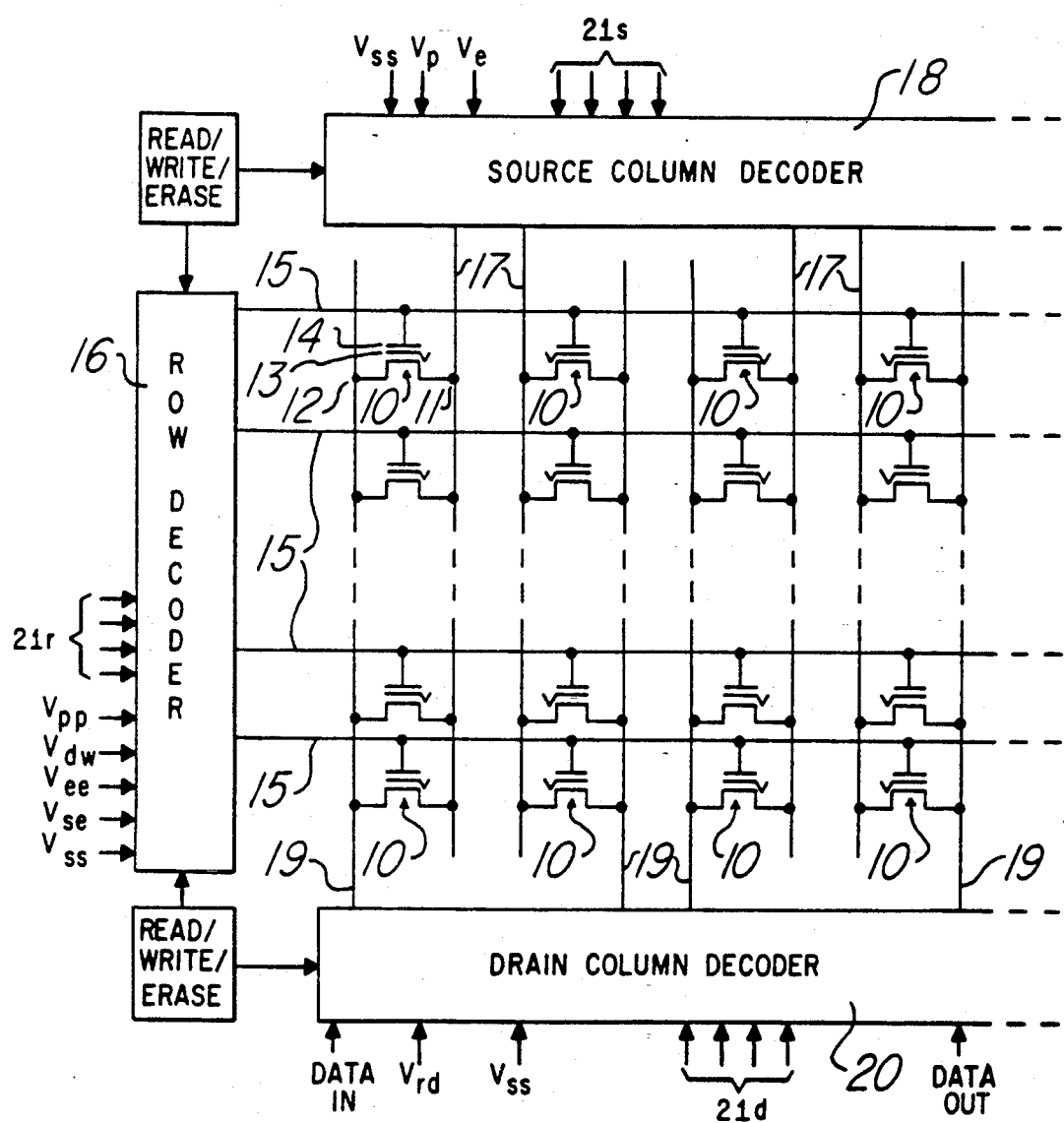
FIG. 1 is a schematic representation, in partial block form, of the circuit of the device of this invention.

Referring to FIG. 1, an array of memory cells, which is an integral part of a memory chip, is shown according to the invention. Each cell is a floating gate transistor 10 having a source 11, a drain 12, a floating gate layer 13 and a control gate 14. Each of the gates 14 in a row of cells is connected to a row line 15, and each of the row lines 15 is connected to a row decoder 16. Each of the source electrodes 11 in a column of cells is connected to a source column line 17, and each of the source column lines 17 is connected to a source column decoder 18. Each of the drain electrodes 12 in a column of cells is connected to a drain column line 19, and each of the drain column lines 19 is connected to a drain column decoder 20.

In a write or program mode, the source column decoder 18, in response to source column address signals on lines 21s, may function to apply a low voltage (Vss or ground) to selected source column line 17 and to apply a higher voltage Vp (approx +7V above Vss) to deselected source column lines 17. The drain column lines 19 may be left floating. The row decoder 16 may function, in response to row address signals on lines 21r, to apply a high voltage Vpp (approx. +16V) to selected row line 15 and to apply a lower voltage Vdw (approx. +7V) to deselected row lines 15. The cell of this invention may also be programmed using channel hot electron programming on the drain side of the floating gate.

During erase mode, the source column decoder 18 functions to apply a positive voltage Ve (approx. +5V) to all the source columns 17. The drain column decoder 20 functions to leave all drain column lines 19 floating. The row decoder 16 functions to apply a high negative voltage Vee (approx. −11V) to all the row lines 15.

In read mode, the drain column decoder 20 functions, in response to drain column address signals on lines 21d, to apply a positive voltage Vrd (approx. +1.5V) to the selected drain column 19. The source column decoder 18 functions to connect all source columns 17 to ground (or Vss). The row decoder 16 functions, in response to row address signals on lines 21r, to apply a positive voltage Vse (approx. +3V) to selected row line 15 and to apply a low voltage (ground or Vss) to deselected row lines 15.

Figure 2:
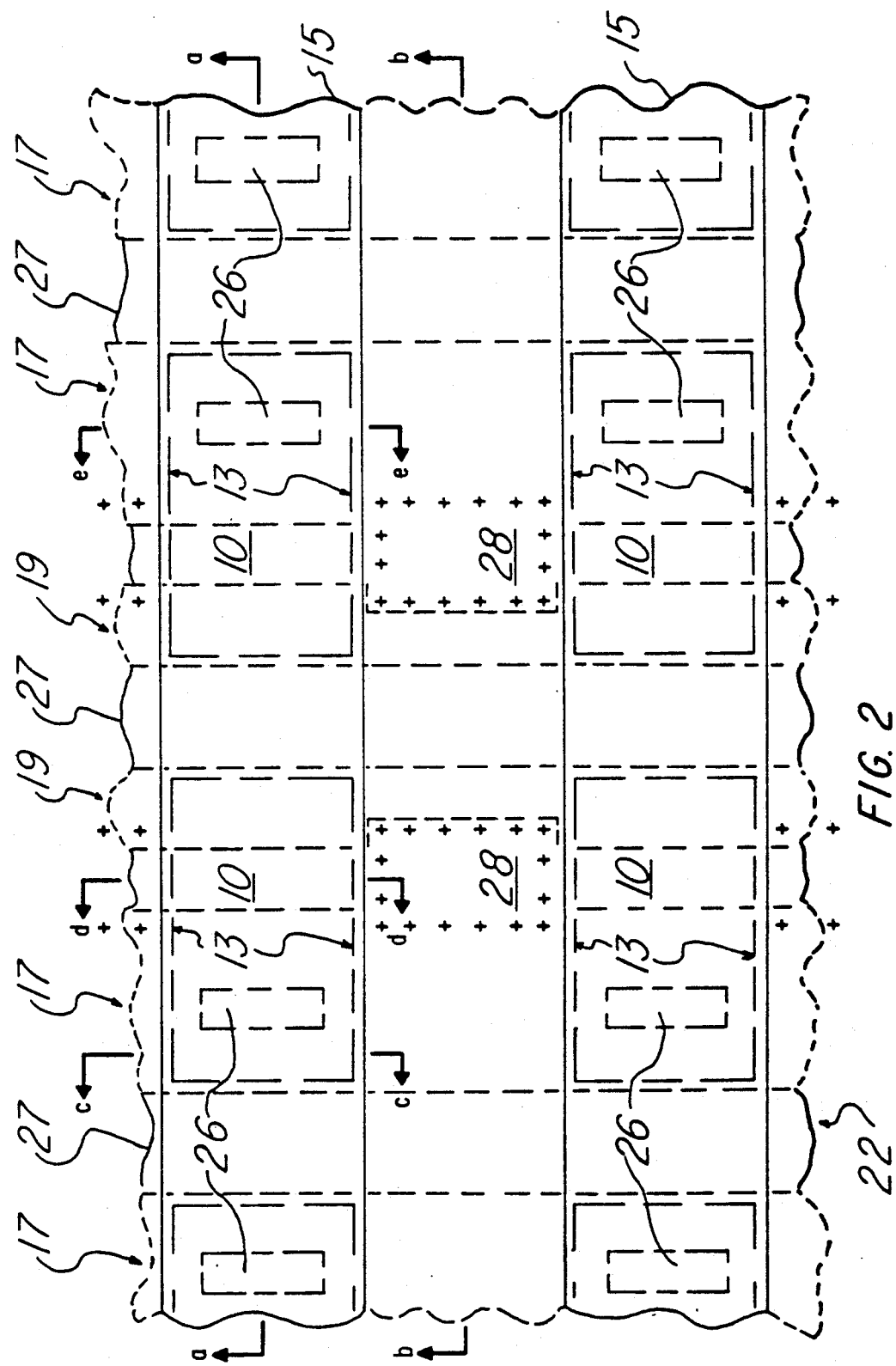
FIG. 2 is a plan view of a small part of a semiconductor chip having memory cells according to one embodiment.

Referring now to FIGS. 2 and 3a-3e, an array of electrically-erasable, electrically-programmable memory cells 10 is shown formed in a face of a semiconductor body, such as a silicon substrate, 22. Only a very small part of the substrate 22 is shown in the FIGS., it being understood that these cells 10 are part of an array of a very large number of such cells 10. A number of control gates 14/row lines 15 are formed by second-level polycrystalline silicon (polysilicon) strips extending along the face of the substrate 22. Control gates 14 are separated from floating gate layers 13 by inter-level insulator layers 23. Source column lines, or bitlines, 17 are formed beneath first and second thick thermal oxide regions 24a and 24b in the face. Drain column lines, or bitlines, 19 are formed beneath third thick thermal oxide regions 24c in the face. Drain column lines 19 are parallel to and spaced from source column lines 17. These buried bitlines 17,19 include the source region 11 and the drain region 12 for each of the cells 10. A floating gate layer 13 for each cell 10 is formed by a first-level polysilicon layer extending across the channel region between spaced-apart source region 11 and drain region 12 and extending over the associated bitlines 17,19. A gate insulator, such as an oxide layer 25 is formed over the channel region. The two "horizontal", or row-direction, edges of the floating gate layer 13 for a cell 10 are aligned with the edges of a row line 15. For explanatory purposes, the edges are illustrated in FIG. 2 as being slightly misaligned.

A tunnel area 26 for programming and erasure may be formed over bitline 17 between first and second thermal oxide regions 24a and 24b adjacent each cell 10. The tunnel insulator at tunnel window 26 may be a thinner oxide layer, about 100A, compared to the oxide dielectric layer 25 of about 350A at the channel. Programming and erasing can be performed at relatively low externally-applied voltages using this structure. The capacitance between layer 14 and layer 13, compared to the capacitance between floating gate layer 13 and source 11 or substrate 22, is more favorable because the floating gate layer 13 extends out across thick thermal oxide regions 24a, 24b and 24c. Therefore, a larger fraction of the programming/erasing voltages applied between control gate 14 and source 11 will appear between floating gate layer 13 and source 11. The cell 10 is referred to as "contact-free" in that no source/drain contact is needed in the vicinity of cell 10 itself.

The bitlines 17,19 of adjacent columns of cells 10 are electrically isolated from each other by trenches 27, which extend into the substrate 22 below the bitlines 17,19. The channels of cells 10 in adjacent rows are electrically isolated by trenches, or ditches 28, which extend into the substrate 22. In the alternative, the channels of adjacent cells 10 may be electrically isolated by a LOCOS thick field oxide region formed over region, located where ditches 28 are located, and implanted with a P-type impurity. The trenches 27 and ditches 28 may be filled with oxide.

Note that the array of cells 10 is not of the "virtual-ground-circuit" type; that is, there is a separate bitline 17,19 for the sources 11 in a column of cells 10 and for the drains 12 in a column of cells 10.

A method of making the device of FIGS. 1, 2, and 3a-3e will be described in reference to FIGS. 4a-4f.

The starting material is a slice of P-type silicon of which the substrate 22 is only a very small portion. The slice is perhaps 6 inches in diameter, while the portion shown in FIG. 2 is only a few microns wide. A number of process steps would be performed to create transistors peripheral to the array, and these will not be discussed here. For example, the memory device may be of the complementary field-effect type having N-wells and P-wells formed in the substrate 22 as part of a prior process to create peripheral transistors.

Referring to FIG. 4a, the first step related to the cell array of the invention is patterning a photoresist layer over what will be the channel regions and tunnel areas 26, sources 11, drains 12, parts of bitlines 17, and bitlines 19, while exposing the first line areas where the thick oxide region 24a is to be formed. An N-type implant, perhaps arsenic at a dosage of about $6 \times 10^{15}$ cm$^2$ at 135 KeV is performed to create first source column lines, which will be parts of bitlines 17. Then first thermal oxide region 24a is grown to a thickness of about 2500 to 3500A by exposing to steam at about 800° to 900° C. The first thermal oxide regions 24a have "bird's beaks" instead of sharp transitions. The areas not implanted between thermal oxide regions 24a are covered with layers 30 of oxide which grow during the exposure to steam, but at a rate much slower than the rate of the areas implanted with arsenic.

Turning now to FIG. 4b, in second and third line areas between first thermal oxide regions 24a, an N-type implant AS such as arsenic is again performed at a dosage of about $6 \times 10^{15}$ cm$^{-2}$ at 135 KeV, using photoresist 31 as an implant mask, to dope what will become drain column lines 19 including drain regions 12 and what will become second source column lines or the remainder of bitlines 17 including source regions 11.

Figure 4C:
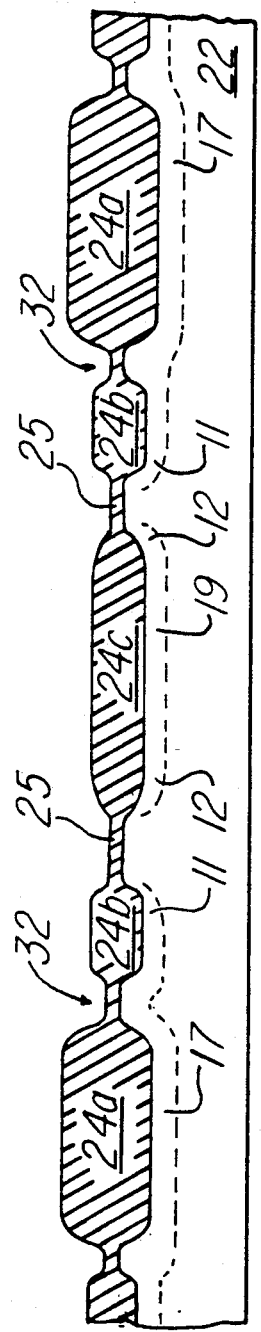

As illustrated in FIG. 4c, second and third thermal oxide regions 24b and 24c are grown on the face to a thickness of about 2500 to 3500A over the N+ buried bitlines 17,19, during which time a thermal oxide layer 25 of about 300–400A will grow over the channel areas (due to the differential oxidation occurring when heavily-doped and lightly-doped silicon areas are exposed to oxidation at the same time), at the same time creating bitlines 19 including drain regions 12 and the remainder of bitlines 17 including source regions 11. This oxidation is done in steam at about 800° to 900° C. At the transition areas 32 where the bird's beak has been formed, the edge of first thermal oxide region 24a has masked the arsenic implant so the concentration is lower and so the oxide growth in that area is less than that of the thermal oxide 24a or the thermal oxide 24b.

Figure 4D:
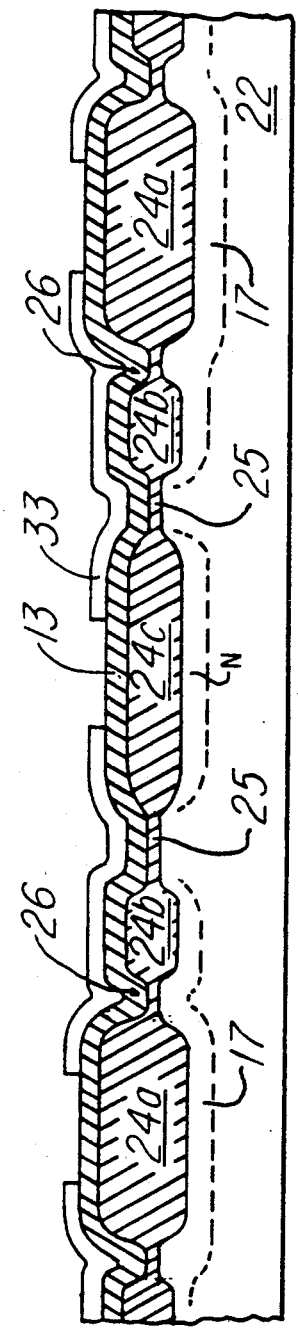

Referring to FIG. 4d, a window 26 is opened in the oxide in the transition area 32 between first thermal oxide region 24a and second thermal oxide region 24b. This is done by using photoresist as a mask, and etching through the oxide of transition area 32 to the bare silicon, then regrowing a thinner oxide for the tunnel window 26. During oxidation of tunnel window 26, gate oxide 25 will grow to approximately 400–450A. Optionally, a self-aligned N-type implant (phosphorus or arsenic, for example) in the tunnel window 26 can be performed before or after oxidation of tunnel window 26. Photoresist should be used to mask areas during the N-type implant in the window 26.

Because of the curved surface of transition area 32, the width of tunnel window 26 may be controlled by varying the length of time for the etch through transition area 32.

As illustrated in FIG. 4d, a first polysilicon layer 13, doped N+, is now applied to the face of the silicon slice. The first-level polysilicon layer 13 is defined using photoresist 33.

Figure 4E:
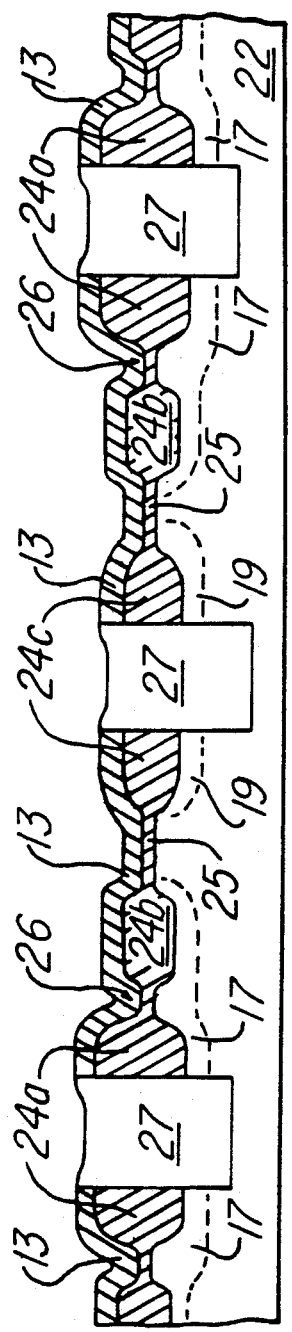

Referring now to FIG. 4e, using photoresist layer 33 as a mask, trenches 27 are etched through polysilicon layer 13, first and third thermal oxide regions 24a and 24c and bitlines 17,19 into substrate 22. A boron implant may be formed in the trench areas 27 before stripping the photoresist. The trenches 27 are filled with oxide by a conventional means that also deposits oxide over the entire surface of the device. The oxide is then subjected to a directional etch to remove the oxide from the surface, while leaving the trenches 27 filled and the upper surface planar.

Figure 3A:
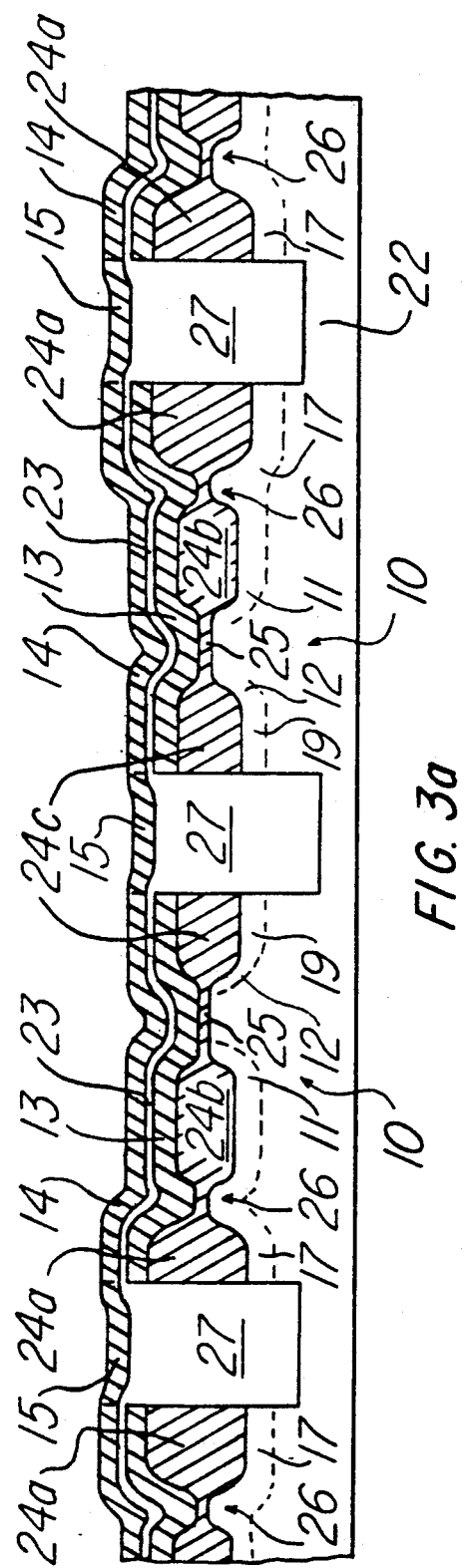
Figure 3B:
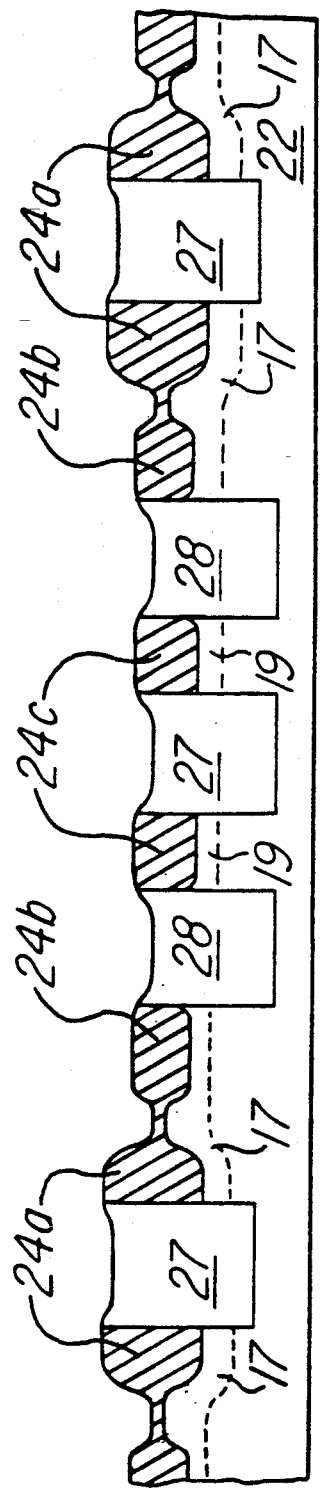

Turning now to FIG. 4f, a coating 23 of oxide, or oxide-nitride-oxide, is applied to insulate floating gate layers 13 from control gates 14. A second polysilicon layer 14 is deposited, doped N+, and patterned using photoresist to create the control gates 14/row lines 15. At the same time as the control gates 14/row lines 15 are defined, the edges of the first-level polysilicon are etched, so that the elongated row-direction edges of the floating gate layers 13 are self-aligned with the edges of the control gates 14. It should be noted that the FIGS. are not drawn to scale and that, in particular, the thicknesses of the first and second polysilicon layers are generally much greater than the thicknesses of oxide layers 25 and 26. At this time, ditches 28 shown in FIGS. 2, 3b and 3d are formed. Ditches 28 may also be filled with oxide in a manner similar to that used to fill trenches 27, as described above.

After defining the structure shown in the FIGS., exposed edges of the first and second polysilicon layers are covered with an insulating coating such as oxide, which improves reliability. The upper surface of the structure is covered with a protective overcap of insulating material, contact holes are etched, and metal conductors are formed in accordance with conventional procedures.

Referring now to FIGS. 5a–5e, an alternate method for constructing the memory array of FIGS. 1 and 2 is illustrated. A photoresist layer is formed over what will be the channel regions and tunnel areas 26, sources 11, and parts of bitlines 17, while exposing the first and third line areas to implant, where first thermal oxide regions 24a and third thermal oxide regions 24c are to be formed. An arsenic implant at a dosage of about $6 \times 10^{15}$ cm$^{-2}$ at 135 KeV is performed to create bitlines 19 and first source column lines, or parts of bitlines 17. After removing the photoresist, first thermal oxide regions 24a and third thermal oxide regions 24c are grown to a thickness of about 2500 to 3500A by exposing to steam at about 800° to 900° C. The thermal oxide regions 24a and 24c have "bird's beaks" as in FIG. 5a, instead of sharp transitions. Drain column lines 19, including drain regions 12, are formed under the thermal oxide regions 24c. The areas not implanted between thermal oxide regions 24a and 24c are covered with layers 30 of oxide which grow during the exposure to steam, but at a rate much slower than the rate of the areas implanted with arsenic impurity.

Turning now to FIG. 5b, an arsenic implant is performed in a second line area at a dosage of about $6 \times 10^{15}$ cm$^{-2}$ at 135 KeV to create transition areas 32 and second source column lines, or the remainder of bitlines 17, including source regions 11.

Figure 5C:
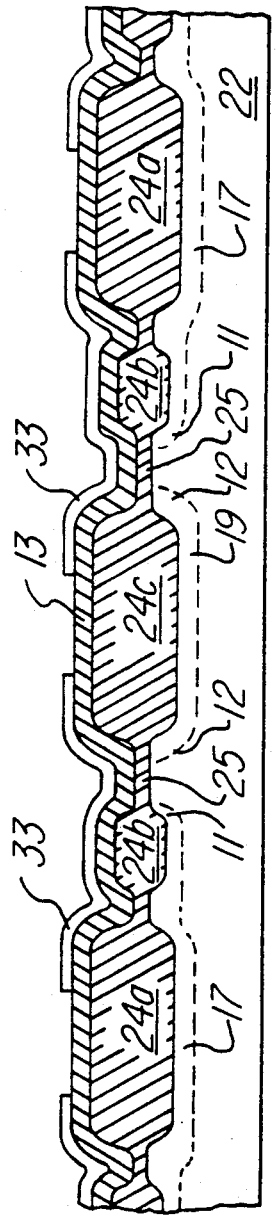
Figure 5D:
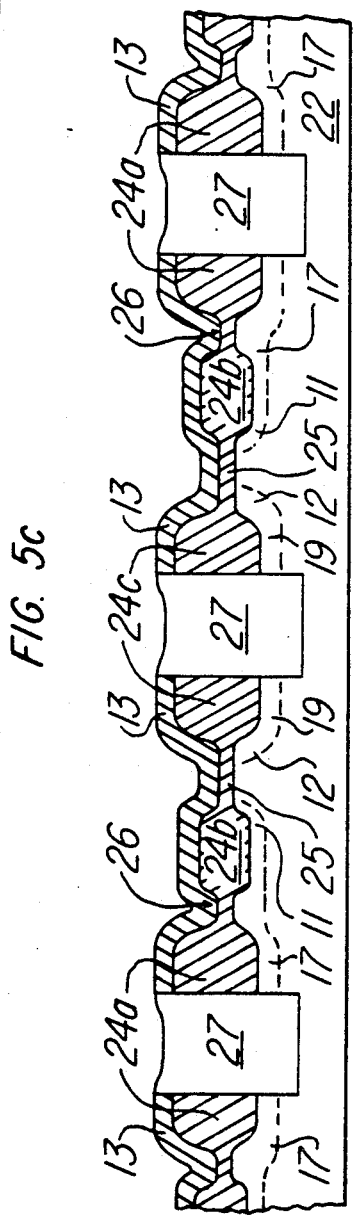
Figure 5E:
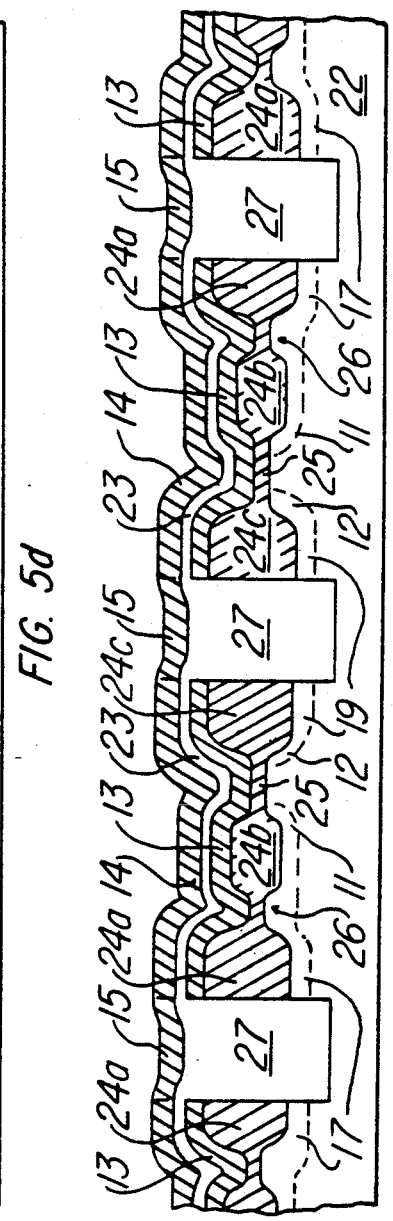

The steps describing the procedure illustrated in FIGS. 5c-5e are similar to the steps used to describe FIGS. 4d-4f and will not be repeated here.

FIGS. 6a-6e illustrate a method for constructing a split-gate embodiment of the memory array of this invention. The procedure for forming the structure of FIG. 6a is the same as that described above in reference to FIG. 5a and need not be repeated here.

Turning now to FIG. 6b, trenches 27 are formed in thermal oxide regions 24a and 24c, extending through bitlines 17 and 19. The trenches 27 are filled with oxide and the surface is made planar, as discussed previously in reference to FIG. 4e.

Referring to FIG. 6c, an arsenic implant is performed in second line areas at a dosage of about $6 \times 10^{15}$ cm$^{-2}$ at 135 KeV, using photoresist as an implant mask, to create transition areas 32 and second source column lines, or the remainder of bitlines 17, including source regions 11.

As illustrated in FIG. 6d, windows 26 are opened in the oxide in each transition area 32, as described above in reference to FIG. 4d. First polysilicon layer 13, doped N+, is applied to the face of the slice. Inter-level insulator layer 23 is formed over first polysilicon layer 13. Layers 23 and 13 are etched to form strips 13 with one edge of each strip 13 located above the channel region between each source 11 and drain 12. Strips 13, after a stack etch to be described later, will become floating gates 13. A sidewall oxide cap is formed on each exposed edge of control gate strips 13 using conventional methods.

Referring now to FIG. 6e, a second polysilicon layer 14 is deposited, doped N+, and patterned using photoresist to create control gates 14/row lines 15, as discussed in reference to FIG. 4f. As discussed in reference to FIG. 4f, ditch isolating regions 28 are formed at this time.

If junction isolation is to be used for the ditch isolating regions 28, a self-aligned ion-implant step is performed, using the stacked polysilicon-1 and polysilicon-2 layers of control gates 14/row lines 15 and floating gate layers 13 as a mask for a channel-stop implant. For this purpose, boron is implanted at a dosage of about $10^{12}$ cm$^{-2}$, at about 70 KeV. After annealing and oxidation, this implant produces P+ channel stop regions that may improve electrical isolation between cells 10. A similar implant may be used in tunnel isolating regions 27.

An increase in density of memory cells in the array of this invention has been made possible by elimination of the LOCOS field oxide used for isolation between bitlines in many prior-art arrays.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

What is claimed is:

1. A method for making a nonvolatile memory array including column lines in a face of a semiconductor body and including row lines on said face, comprising:

patterning a first layer of photoresist to expose first line areas on said face of said semiconductor body;

selectively implanting an impurity of conductivity-type opposite that of said semiconductor body into said face to create first source column lines in said first line areas on said face;

growing first thermal oxide regions over said first source column lines;

patterning a second layer of photoresist on said face to expose second line areas adjacent said first lien areas and to expose third line areas spaced from and parallel to said second line areas;

selectively implanting an impurity of said opposite conductivity-type into said face to create second source column lines in said second line areas and to create drain column lines in said third line areas on said face;

growing second and third thermal oxide regions over said second source column lines and said drain column lines;

growing a gate oxide coating on said face over areas between said second source column lines and said drain column lines to a first thickness less than the thickness of said second and third thermal oxide regions;

opening window areas between said first and second thermal oxide regions and regrowing gate oxides in said windows to a second thickness thinner than said first thickness to thereby provide tunnel windows;

applying a first conductive layer on said face and patterning said first conductive layer to leave floating gate layers over channel areas between said second source column lines and said drain column lines, said conductive layer overlapping said first, second and third thermal oxide regions;

forming trenches extending through said first conductive layer, said first thermal oxide regions and said first source column lines to separate a column of cells from a first adjacent column of cells and forming trenches extending through said first conductive layer, said third thermal oxide regions and said drain column lines to separate a column of cells from a second adjacent column of cells;

applying a second conductive layer on said face overlying and insulated from said first conductive layer; and patterning and etching said second conductive layer and said first conductive layer to form floating gates and to form row lines perpendicular to said column lines, said row lines including control gates overlying said floating gates.

2. A method according to claim 1, wherein ditches are formed between said second thermal oxide region and said third thermal oxide regions and between said row lines and wherein said ditches extend into said face.

3. A method according to claim 1, wherein ditches are formed between said second thermal oxide regions and said third thermal oxide regions and between said row lines and wherein said ditches extend into said face and wherein a region at the bottom of said ditches is doped with an impurity of the same conductivity-type as that of said semiconductor body.

4. A method according to claim 1, wherein LOCOS field oxide regions are formed in said semiconductor body between said second thermal oxide regions and said third thermal oxide regions and between said row lines and wherein said LOCOS regions are formed prior to forming said photoresist layer to expose said first line areas.

5. A method according to claim 1, wherein said semiconductor body is P-type silicon and said impurity of opposite conductivity-type is N-type.

6. A method according to claim 1, wherein said first and second conductive layers are doped polycrystalline silicon.

7. A method according to claim 1, wherein an impurity of said opposite conductivity-type is implanted in said tunnel windows after regrowing said gate oxides in said windows.

8. A method for making a nonvolatile memory array including column lines in a face of a semiconductor body and including row lines on said face, comprising:
   patterning a layer of photoresist to expose first line areas and third line areas on said face of said semiconductor body, said third line areas parallel to and spaced from said first line areas;
   selectively implanting an impurity of conductivity-type opposite that of said semiconductor body into said face to create first source column lines in said first line areas on said face and to create drain column lines in said third line areas on said face of said semiconductor body;
   growing first thermal oxide regions over said first source column lines and third thermal oxide regions over said drain column lines;
   patterning a second layer of photoresist on said face to expose second line areas adjacent said first line areas;
   selectively implanting an impurity of said opposite conductivity-type into said face to create second source column lines in said second line areas;
   growing second thermal oxide regions over said second source column lines;
   growing a gate oxide coating on said face over areas between said second source column lines and said drain column lines to a first thickness less than the thickness of said second oxide regions;
   opening window areas between said first and second thermal oxide regions and regrowing gate oxides in said windows to a second thickness thinner than said first thickness to thereby provide tunnel windows;
   applying a first conductive layer and an interlevel insulation layer on said face and patterning said first conductive layer and said interlevel insulation layer to leave floating gate layers over at least a part of each channel area between said second source column lines and said drain column lines, said floating gate layers overlapping at least said first and second thermal oxide regions;
   forming trenches extending through said first thermal oxide regions and said first source column lines to separate a column of cells from a first adjacent column of cells and forming trenches extending through said third thermal oxide regions and said drain column lines to separate a column of cells from a second adjacent column of cells;
   applying a second conductive layer on said face overlying and insulated from said first conductive layer; and
   patterning and etching said second conductive layer and said first conductive layer to form floating gates and to form row lines perpendicular to said column lines, said row lines including control gates overlying said floating gates.

9. A method according to claim 8, wherein ditches are formed between said second thermal oxide regions and said third thermal oxide regions and between said row lines and wherein said ditches extend into said face.

10. A method according to claim 8, wherein ditches are formed between said second thermal oxide regions and said third thermal oxide regions and between said row lines and wherein said ditches extend into said face and wherein a region at the bottom of said ditches is doped with an impurity of the same conductivity-type as that of said semiconductor body.

11. A method according to claim 8, wherein LOCOS field oxide regions are formed in said semiconductor body between said second thermal oxide regions and said third thermal oxide regions and between said row lines and wherein said LOCOS regions are formed prior to forming said photoresist layer to expose said first line areas.

12. A method according to claim 8, wherein said semiconductor body is P-type silicon and said impurity of opposite conductivity-type is N-type.

13. A method according to claim 8, wherein said first and second conductive layers are doped polycrystalline silicon.

14. A method according to claim 8, wherein an impurity of said opposite conductivity-type is implanted in said tunnel windows after regrowing said gate oxides in said windows.

15. A method according to claim 8, wherein said trenches are formed, then filled with oxide, prior to patterning said second photoresist layer.

16. A method for making a nonvolatile memory array having rows and columns of memory cells in a face of a semiconductor body, comprising the steps of:
   forming a plurality of first source column lines and a plurality of drain column liens in said face, said first source column lines including sources of individual memory cells, said drain column lines including drains of individual memory cells, each said source and each said drain of each said individual memory cell being spaced apart by a channel area;
   forming a plurality of first insulator regions and a plurality of second insulator regions, each first insulator region overlying a source column line, each second insulator region overlying a drain column line;
   forming for each said memory cell a floating gate extending over at least a portion of said channel area and a control gate extending over said floating gate; and
   forming a plurality of first trenches, each first trench extending through one of said first insulator regions and one of said first source column lines to separate a column of cells from a first adjacent column of cells.

17. The method of claim 14 further comprising the step of:
   forming a plurality of second trenches, each second trench extending through one of said second insulator regions and one of said drain column lines to separate a column of cells from a second adjacent column of cells.

18. The method of claim 17 further comprising the step of:
   filling said first and second trenches with an insulating material.

19. The method of claim 16 further comprising the steps of:

forming a plurality of second source column lines, each second source column line adjacent one of said first source column lines; and forming a plurality of third insulator regions, each third insulator region overlying a second source column line and adjacent one of said first insulator regions.

20. The method of claim 19 further comprising the step of:

forming for each of said individual memory cells a tunnel window between a first insulator region and an adjacent third insulator region.

* * * * *